United States Patent [19]
Clapp, III

[11] Patent Number: 5,412,531
[45] Date of Patent: May 2, 1995

[54] APPARATUS AND METHOD FOR EXTENDING THE BREAKDOWN CAPABILITY OF A SWITCHING CIRCUIT

[75] Inventor: John S. Clapp, III, Plano, Tex.

[73] Assignee: Texas Instruments Incorporated, Dallas, Tex.

[21] Appl. No.: 843

[22] Filed: Jan. 5, 1993

[51] Int. Cl.$^6$ ............................................. H01H 47/00
[52] U.S. Cl. ................................... 361/190; 361/154; 307/113
[58] Field of Search ................ 361/139, 152, 154, 160, 361/170, 171, 189, 190, 206; 307/112, 113, 115, 116, 125, 139

[56] References Cited

U.S. PATENT DOCUMENTS 4,618,908 10/1986 Anttila ................................ 361/187
5,111,353 5/1992 Kotowski et al. ..................... 361/91

Primary Examiner—Jeffrey A. Gaffin
Attorney, Agent, or Firm—Robby T. Holland; Wade James Brady, II; Richard L. Donaldson

[57] ABSTRACT

A circuit (16) having an extended breakdown capability is provided for switching an inductive load driver (12). The circuit (16) includes a first switch (18) for providing a first drive voltage when the first switch (18) is closed. A second switch (20) is provided for receiving the first drive voltage from the first switch (18) and delivering the first drive voltage to the inductive load driver (12) when the second switch (20) is closed. The second switch (20) limits the voltage across the first switch (18) to a predetermined level when the first switch (18) is open. A third switch (22) provides a second drive voltage to the inductive load driver (12) when the third switch (22) is closed.

19 Claims, 2 Drawing Sheets

APPARATUS AND METHOD FOR EXTENDING THE BREAKDOWN CAPABILITY OF A SWITCHING CIRCUIT

TECHNICAL FIELD OF THE INVENTION

The invention relates generally to the field of electronic switching circuits and more specifically relates to apparatus and methods for preventing breakdown of circuit elements in a switching circuit exposed to a flyback voltage.

BACKGROUND OF THE INVENTION

It is often necessary to switch "on" and "off" a circuit for driving an inductive load. A "pre-driver" circuit, is often used for this switching function.

When the inductive load is switched "off", it generates a "flyback" voltage waveform having a large voltage peak. The peak of the flyback voltage waveform can be in the tens or hundreds of volts. Thus, the elements of the pre-driver, such as the switching transistors, must have a breakdown voltage high enough to withstand the large voltage peaks associated with the flyback voltage waveform. If their breakdown voltages are not high enough, the large voltage peaks may permanently damage the transistors.

A problem arises when it is desired to implement a pre-driver that will be exposed to large flyback voltage peaks. Very often, standard or off-the-shelf transistors have too low a breakdown voltage to withstand the flyback voltages generated by the inductive load drivers that they are designed to switch.

One solution to this problem is to use transistors having a breakdown voltage large enough to withstand the generated flyback voltage peaks. However, such transistors may be substantially more expensive than standard transistors. Additionally, such transistors may be in short supply in the market place, making them more difficult to obtain than standard transistors. Finally, increasing the breakdown voltage of a transistor may also cause undesirable changes in other characteristics of the transistor. For example, the physical size of the transistor may be increased, or its operating speed may be reduced.

The problem is compounded when it is desired to implement the pre-driver as an integrated circuit. Again, the standard transistors used within the integrated circuit may not have high enough breakdown voltages to withstand the expected flyback voltage peaks, and increasing transistor size is not an option.

A need has thus arisen for a pre-driver circuit that will not be damaged by a flyback voltage and that can be implemented without altering the breakdown voltages of its transistor components.

SUMMARY OF THE INVENTION

In accordance with the present invention, a circuit for switching an inductive load driver is provided. The circuit has an extended breakdown capability. The circuit includes a first switch for providing a first drive voltage when the first switch is closed. A second switch is included for receiving the first drive voltage from the first switch and delivering the first drive voltage to the inductive load driver when the second switch is closed. The second switch limits the voltage across the first switch to a predetermined level when the first switch is open. Additionally, a third switch is included for providing a second drive voltage to the inductive load driver when the third switch is closed.

A first technical advantage of the present invention is that it distributes the flyback voltage among its switching elements.

A second technical advantage of the present invention is that it can withstand higher flyback voltage peaks without damage to any of its switching elements.

A third technical advantage of the present invention is that it can be implemented as an integrated circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-4 of the drawings, like numerals being used for like and corresponding parts of the various drawings.

Figure 1:
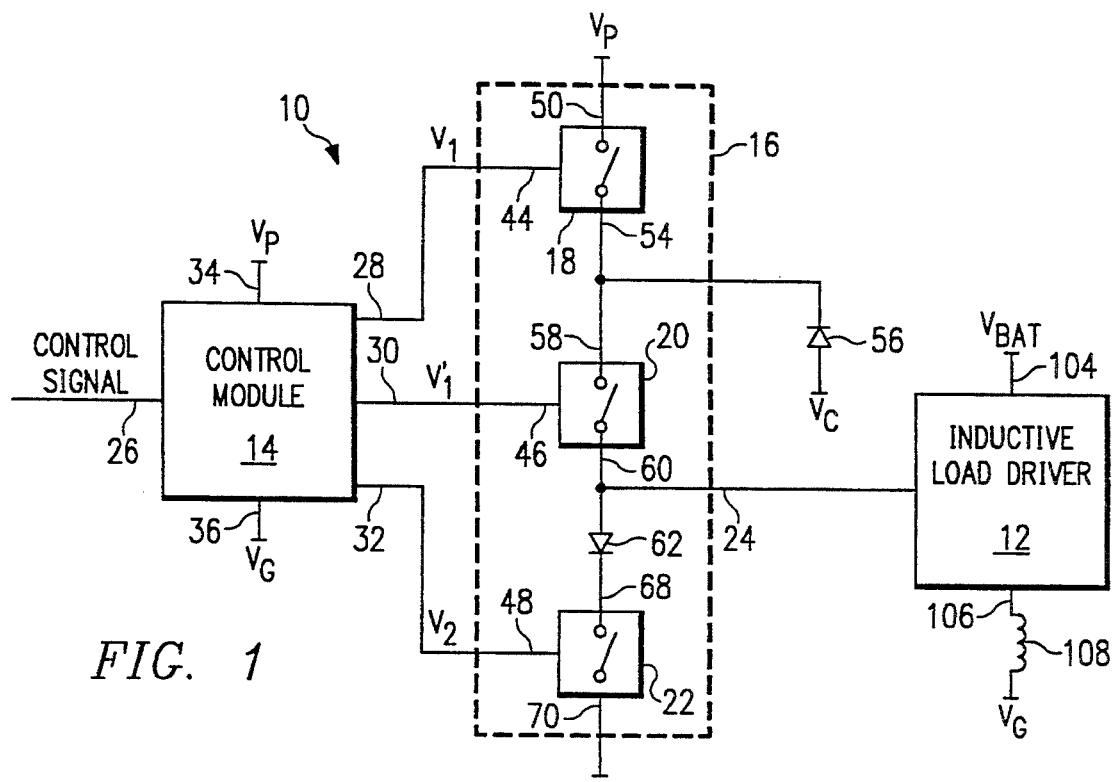
FIG. 1 is a circuit for switching an inductive load driver.

FIG. 1 is a circuit 10 for switching an inductive load driver 12. Circuit 10 includes a switching signal generator or control module 14 coupled to a pre-driver 16. Control module 14 generates three control signals, V1, V1', and V2, which respectively control the three switches, 18, 20, 22, of pre-driver 16. Pre-driver 16, in response to the three signals, generates a switching signal on output terminal 24. This switching signal toggles "on" and "off" inductive load driver 12.

More specifically, control module 14 has an input terminal 26 for receiving a control signal, whose transition edges indicate when inductive load driver 12 is to be switched. The source of the control signal can be any type of automatic controller.

Control module 14 also has three output terminals 28, 30, and 32 for respectively transmitting signals V1, V1', and V2. Further, control module 14 has a power supply terminal 34 coupled to a voltage $V_P$, and a power supply terminal 36 coupled to voltage $V_G$. In this embodiment, $V_P$ is equal to $V_{Bat}+10$ volts, or approximately 22 volts, and $V_G$ is ground or 0 volts. In this embodiment, $V_{Bat}$ is approximately 12 volts, although $V_{Bat}$ may be different voltage levels in other embodiments. $V_P$ and $V_G$ may also have different values in other embodiments. The internal portion (not shown) of control module 14 which generates signals V1 and V1' can be comprised of a high voltage level shifter such as the one described in pending U.S. patent application Ser. No. 07/991,622 entitled "Method and Apparatus for High Voltage Level Shifting" (Attorney's docket TI-18011).

Pre-driver 16 has three switches 18, 20, and 22 each having a control input terminal 44, 46 and 48 respectively. Control input terminal 44 is coupled to output terminal 28 and thus receives signal V1. Control input terminal 46 is coupled to output terminal 30 and receives signal V1'. Control input terminal 48 is coupled to output terminal 32 and thus receives signal V2. First switch 18 provides a power input terminal 50 coupled to voltage $V_P$. First switch 18 also has an output, or limiter, terminal 54. Terminal 54 may be coupled to the cathode of an optional clamp diode 56.

The anode of optional clamp diode 56 is coupled to a voltage $V_{Clamp}$. In this embodiment, $V_{Clamp}$ is ground or 0 volts. In other embodiments, $V_{Clamp}$ may represent different voltage levels.

Second switch 20 has a power input terminal 58 coupled to output terminal 54. Second switch 20 also has an output terminal 60 coupled to main output terminal 24. A protection diode 62 is serially connected between second switch 20 and third switch 22. The anode of protection diode 62 is coupled to main output terminal 24. Third switch 22 has a power input terminal 68 coupled to the cathode of protection diode 62. Third switch 22 also includes an output terminal 70 coupled to a voltage $V_G$. Main output terminal 24 is coupled to the input of inductive load driver 12.

Figure 2:
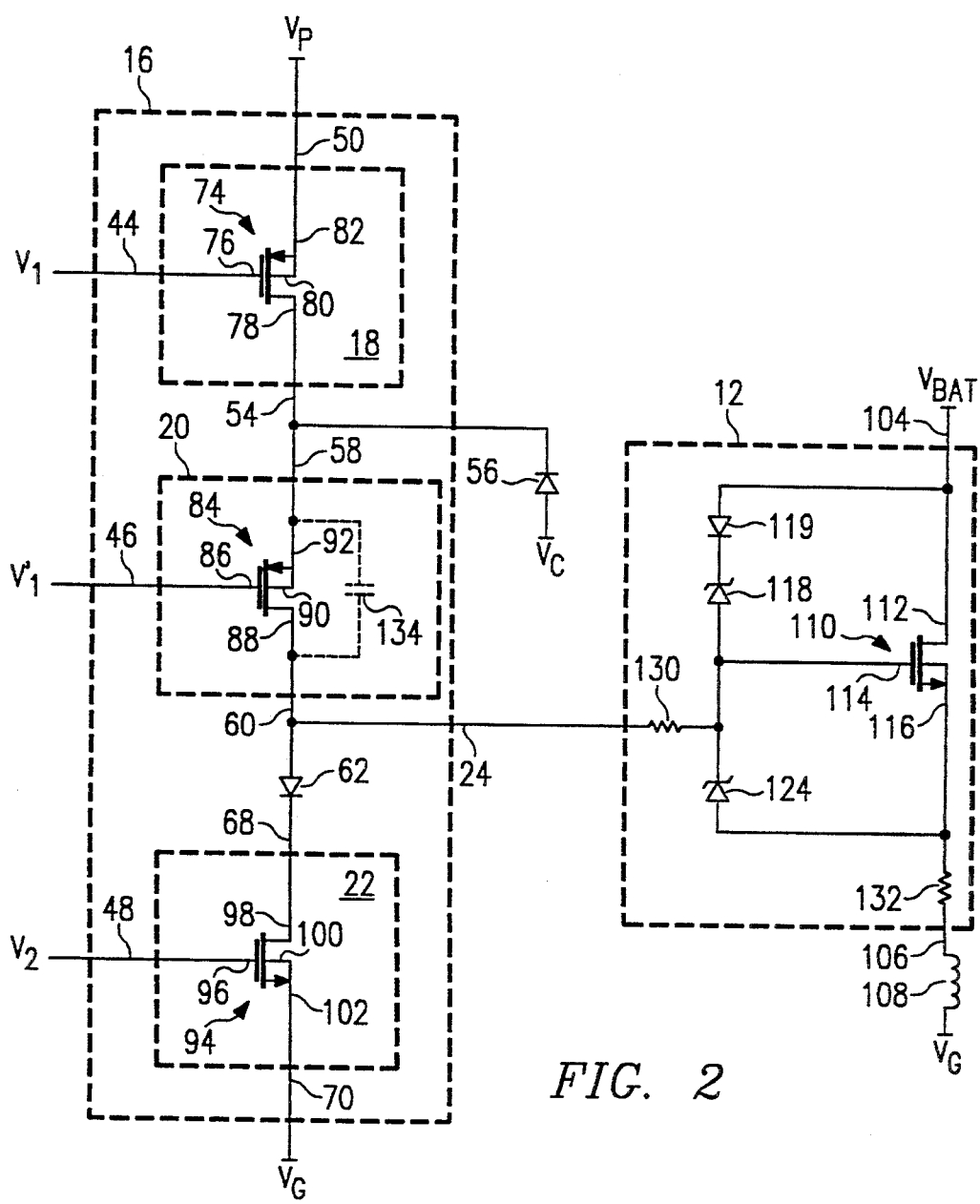
FIG. 2 is a detailed view of the pre-driver of FIG. 1.

FIG. 2 shows one embodiment of pre-driver 16 coupled to one embodiment of inductive load driver 12. In this embodiment, first switch 18 is a P-channel transistor 74. Transistor 74 provides a gate 76 coupled to switch input 44, and a drain 78 coupled to output terminal 54. A backgate 80 and source 82 of transistor 74 are coupled to power input terminal 50. Second switch 20 is a P-channel transistor 84. Transistor 84 has a gate 86 coupled to input 46 and a drain 88 coupled to output terminal 60. A backgate 90 and a source 92 are both coupled to power input terminal 58. Third switch 22 is an N-channel transistor 94. Transistor 94 has a gate 96 coupled to input terminal 48 and a drain 98 coupled to the cathode of protection diode 62. Backgate 100 and source 102 of transistor 94 are both coupled to output terminal 70.

Inductive load driver 12 has an input terminal coupled to output terminal 24, a power supply terminal 104 coupled to a voltage $V_{Bat}$, and a drive output terminal 106 coupled to one side of inductive load 108. Inductive load driver 12 also has an N-channel transistor 110. Transistor 110 has a drain 112 coupled to supply terminal 104, a gate 114 and a source 116. Inductive load driver 12 further includes a zener diode 118 having an anode coupled to gate 114. A diode 119 has a cathode coupled to the cathode of zener diode 118 and has an anode coupled to supply terminal 104. A zener diode 124 has a cathode coupled to gate 114 and an anode coupled to source 116. A resistor 130 is coupled between the input terminal of inductive load driver 12 and gate 114. A resistor 132 is coupled between source 116 and drive output terminal 106.

Figure 3:
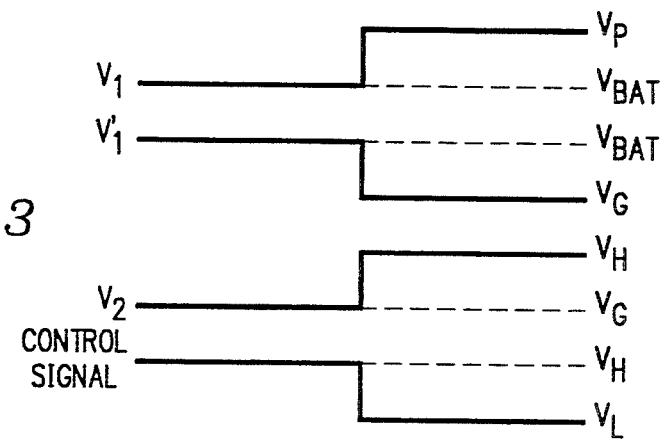
FIG. 3 is a diagram of the voltage levels and relative timing of the signals needed to control the pre-driver of FIG. 1.

FIG. 3 is a signal diagram showing the levels and relative timing of the control signal input on input terminal 26 and signals V1, V1', and V2. V1 is approximately $V_{Bat}$ when the control signal is a high level $V_H$, and transitions to approximately $V_P$ when the control signal transitions to a low level $V_L$. In this embodiment, $V_H$ is approximately five volts and $V_L$ is approximately zero volts. V1' is approximately $V_{Bat}$ when the control signal is $V_H$, and transitions to approximately $V_G$ when the control signal transitions to $V_L$. V2 is approximately $V_G$ when the control signal is $V_H$, and transitions to approximately $V_H$ (although any voltage level between $V_H$ and $V_{Bat}$ is acceptable) when the control signal transitions to $V_L$.

In operation, control module 14, as shown in FIG. 1, generates signals V1, V1' and V2 in response to the control signal input on input terminal 26. The control signal is a logic signal which transitions between $V_H$ and $V_L$. In this embodiment, $V_H$ indicates inductive load driver 12 should be switched "on", and $V_L$ indicates inductive load driver 12 should be switched "off". In other embodiments, however, a high level may indicate "off" and a low level may indicate "on". Control module 14 converts the control signal into signals V1, V1' and V2. When the control signal is at a high level, $V1 = V1' = V_{Bat}$, and $V2 = 0$. The result is that both transistors 74 and 84 are "on", i.e., conducting or closed. Transistor 94 is "off", i.e., nonconducting or open. As the voltage at main output terminal 24 begins to increase, diode 119 becomes nonconducting. This allows the voltage at main output terminal 24 to exceed $V_{Bat}$. Therefore, a voltage approximately equal to $V_P$ appears via transistors 74 and 84 at main output terminal 24, the inductive load driver 12 input terminal, and gate 114. Transistor 110 closes and supplies power to inductive load 108. Thus, inductive load driver 12 is in the "on" state.

At some time later, as shown in FIG. 3, the control signal transitions to low level $V_L$. Signal V1 transitions from $V_{Bat}$ to $V_P$. Signal V1' transitions from $V_{Bat}$ to $V_G$, and signal V2 transitions from $V_G$ to $V_H$. Although in this embodiment V2 transitions to $V_H$, in other embodiments V2 may transition to any voltage between $V_H$ and $V_{Bat}$. Thus, transistors 74 and 84 open, and transistor 94 closes, resulting in $V_G$ plus approximately 1 volt (the junction voltage of protection diode 62) being coupled to gate 114. The closing of transistor 94 results in transistor 110 opening, or turning "off". Inductive load driver 12 is now in its "off" state. The turning "off" of inductive load driver 12, however, causes inductive load 108 to generate a flyback voltage waveform.

This flyback voltage waveform generates a temporary, negative voltage at main output terminal 24 via zener diode 124 and resistor 130. The peak of this temporary negative voltage is limited to $V_{Bat}$ minus the sum of the zener voltage of zener diode 118 and the forward voltage of diode 119. In this embodiment, this zener voltage is 71 volts, although other embodiments of zener diode 118 may employ a different zener voltage. The forward voltage of diode 119 here is approximately 1 volt, although other embodiments of diode 119 may have different forward voltages. (In most embodiments, the sum of the zener voltage of zener diode 118 and the forward voltage of diode 119 is slightly less than sum of $V_{Bat}$ and the breakdown voltage of transistor 84. This relationship insures that the breakdown voltage of transistor 84 will not be exceeded by a flyback voltage peak.) This limiting causes a peak temporary voltage of $-60$ volts to appear at main output terminal 24.

Next, protection diode 62 opens or ceases to conduct in order to protect transistor 94 from the temporary negative voltage. That is, protection diode 62 blocks the temporary negative voltage from transistor 94. Thus, protection diode 62 prevents the junction voltage between drain 98 and source 102 (the voltage across transistor 94) from exceeding the breakdown voltage of transistor 94. Protection diode 62 will remain open until the voltage at main output terminal 24 rises to a safe level, which for this embodiment is approximately 1 volt.

Transistor 84 remains closed until the voltage at power input terminal 58 falls to the threshold voltage of transistor 84, which is approximately 1 volt. Both transistors 74 and 84 remain open until the next transition of V1 and V1' to $V_{Bat}$. Therefore, during the presence of the temporary peak flyback voltage, the voltages, called junction or terminal voltages, across the source-drain junctions of transistors 74, 84 and 94, are below the breakdown voltages of each of those junctions.

Specifically, in this embodiment, the source-drain breakdown voltage of transistors 74, 84 and 94 is approximately 65 volts. During the presence of the temporary peak flyback voltage, the source-drain, or terminal, voltage of transistor 94 is approximately 0 volts. The source-drain voltage of transistor 74 is approximately 21 volts ($V_P$ minus the 1 volt threshold of transistor 84). The source-drain voltage of transistor 84 is approximately 61 volts (the 1 volt threshold of transistor 84 minus −60 volts). All three of these source-drain voltages are less than the 65 volt breakdown and, therefore, transistors 74, 84 and 94 are protected from breakdown damage.

Thus, even though the 82 volts (21 volts + 61 volts) across power input terminal 50 and output terminal 24 exceeds the breakdown voltage of transistors 74 and 84, neither is damaged. The 82 volts is divided or shared between transistors 74 and 84 in such a way that neither transistor is exposed to a junction voltage which exceeds its breakdown voltage.

Referring again to FIG. 2, there sometimes exists a stray or junction capacitance across the source-drain junction of transistor 84, as represented by capacitor 134, drawn in phantom. Capacitor 134 may cause the voltage at power input terminal 58 to temporarily fall far below the transistor 84 threshold voltage while the flyback voltage waveform is present at main output terminal 24. Optional clamp diode 56 clamps the voltage at terminal 58 to approximately 1 volt below $V_{Clamp}$, or to approximately −1 volt ($V_{Clamp}$ is 0 volts in this embodiment). This clamping action prevents the source-drain junction voltage of transistor 74 from exceeding, even for a very short time, 65 volts.

Figure 4:
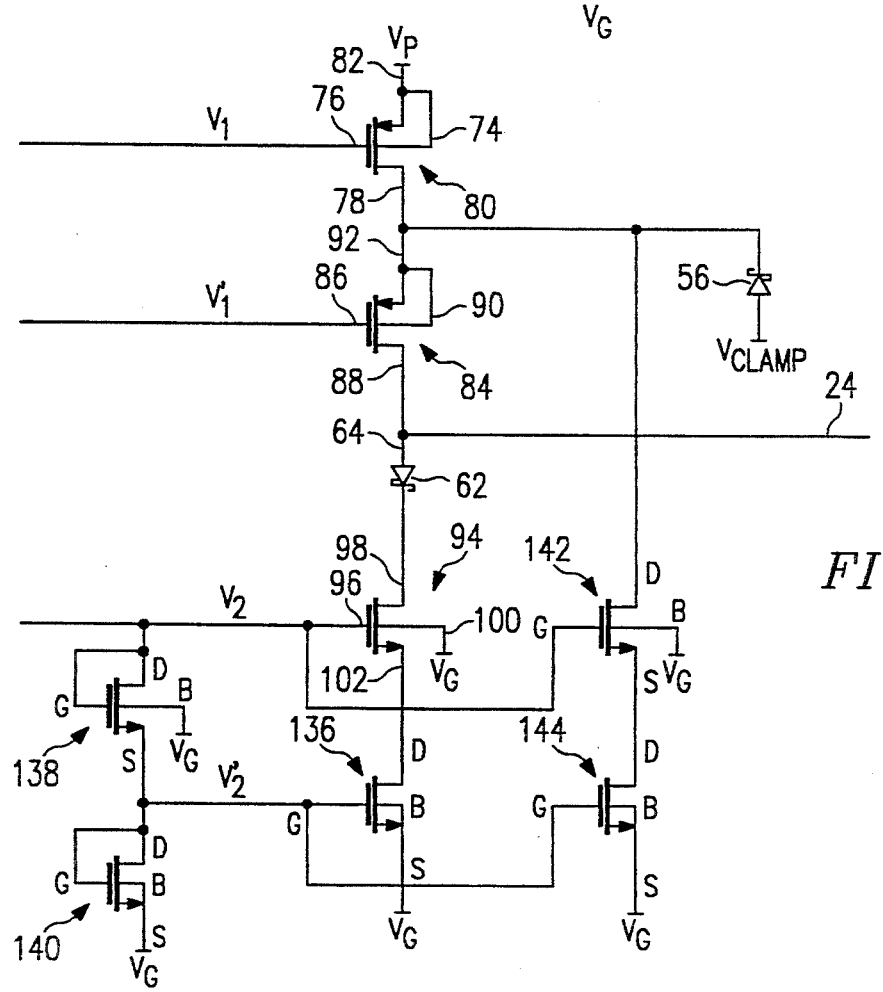
FIG. 4 is an integrated circuit implementation of the pre-driver of FIG. 1.

FIG. 4 shows an alternate embodiment of pre-driver 16, which is particularly suited for implementation as an integrated circuit. This alternate embodiment includes transistors 74, 84 and 94, protection diode 62 and clamp diode 56.

Also included in this alternate embodiment is N-channel transistor 136, whose drain-source junction is coupled between source 102 and $V_G$. A pair of N-channel transistors 138 and 140 provide a drive voltage V2' to the gate of transistor 136. The gate and drain of transistor 138 are both coupled to V2, while the source of transistor 138 is coupled to the gate of transistor 136 and both the gate and drain of transistor 140. The source of transistor 140 is coupled to $V_G$.

Another pair of N-channel transistors 142 and 144 discharge the drain of transistor 74 when transistor 74 is switched off. The drain of transistor 142 is coupled to the drain of transistor 74, while the gate of transistor 142 is coupled to signal V2. The drain of transistor 144 is coupled to the source of transistor 142, and the gate of transistor 144 is coupled to voltage V2'. The source of transistor 144 is coupled to $V_G$.

The operation of the alternative embodiment of FIG. 4 is approximately the same as that of the embodiment of FIG. 2, as discussed above, with the following additions. The pair of transistors 138 and 140 generates V2' from V2. Since transistor 138 is connected in a diode configuration, V2' will always be less than V2 by the gate-to-source voltage of transistor 138. That is, V2' will follow V2 with a constant voltage difference equal to the gate-to-source voltage of transistor 138. The result is that transistors 94, 136, 142 and 144 all transition "on" and "off" at approximately the same time.

Transistors 94 and 136 together act together to sink current from terminal 24 to switch off inductive load driver 12 when V2 transitions to its high state. At the same time, transistors 142 and 144 act in unison to sink current from source 92 to insure a rapid turn-off of transistor 84. This turn-off is accomplished by lowering the voltage at source 92 to a point where the gate to source voltage is less than the threshold voltage of transistor 84.

Although the present invention and its advantages have been described in detail, it should be understood that various changes, substitutions and alterations can be made therein without departing from the spirit and scope of the invention as defined by the appended claims. For example, the disclosed embodiment of the invention is implemented using MOS technology. It is understood that the invention may be implemented using other technologies as well.

What is claimed is:

1. A circuit, having an extended breakdown capability, for switching an inductive load driver, the circuit comprising:
   a first switch for providing a first drive voltage when said first switch is closed;
   a second switch for receiving said first drive voltage from said first switch and delivering said first drive voltage to the inductive load driver when said second switch is closed and for limiting the voltage across said first switch to a predetermined level when said first switch is open; and
   a third switch for providing a second drive voltage to the inductive load driver when said third switch is closed.

2. The circuit of claim 1 wherein the inductive load driver switches an inductive load, said inductive load operable to generate a flyback voltage when said first switch is open, the circuit further comprising a diode for preventing the voltage across said third switch from exceeding a second predetermined level when said flyback voltage is generated.

3. The circuit of claim 2 wherein said diode is coupled between said second and said third switches.

4. The circuit of claim 1 further comprising a control module for generating a plurality of signals to toggle said first, second and third switches.

5. The circuit of claim 1 wherein said first, second, and third switches are serially coupled together.

6. The circuit of claim 1 further comprising a diode for clamping the voltage between said first switch and said second switch to a second predetermined level.

7. A circuit for switching an inductive load driver for driving an inductive load, wherein the inductive load generates a flyback voltage when the inductive load driver is switched off, the circuit comprising:
   a first switch, responsive to a first control signal, for providing a first drive voltage;
   a second switch, responsive to a second control signal, for coupling said drive voltage to the inductive load driver to switch the inductive load driver on when said first switch and said second switch are closed and limiting the voltage across said first switch to a first predetermined level when said first switch is open, said second switch opening when said first drive voltage changes to a second predetermined level;

a third switch, responsive to a third control signal, for coupling a second drive voltage to the inductive load driver to switch the inductive load driver off; and a diode for preventing the voltage across said third switch from exceeding a third predetermined level when the flyback voltage is generated.

8. The circuit of claim 7 further comprising a control module, responsive to a switching signal, for generating said first control signal, said second control signal and said third control signal.

9. The circuit of claim 7 further comprising a second diode for limiting said voltage across said first switch to a fourth predetermined level greater than said first predetermined level.

10. The circuit of claim 9 wherein said second diode is coupled between said first switch and a clamp voltage.

11. The circuit of claim 7 wherein said diode is coupled between said second and said third switches.

12. The circuit of claim 7 wherein said first switch, said second switch and said third switch comprise a first transistor, a second transistor having a threshold voltage and a third transistor respectively.

13. The circuit of claim 12 wherein said second predetermined voltage is equal to said threshold voltage.

14. The circuit of claim 7 wherein said third switch comprises a cascaded pair of transistors having a top and a bottom transistor.

15. The circuit of claim 14 further comprising a diode configured pair of transistors for driving said bottom transistor.

16. The circuit of claim 14 further comprising a second cascaded pair of transistors for discharging the voltage between said first and said second switches when said first switch is open.

17. A method for extending the breakdown capability of a switching circuit comprising the steps of:

controlling a first switch to provide a first drive voltage;

controlling a second switch to couple said first drive voltage to an inductive load driver when said second switch is closed and to limit the voltage across said first switch to a predetermined level when said first switch is open; and controlling a third switch to provide a second drive voltage to said inductive load driver.

18. The method of claim 17 further comprising the step of preventing the voltage across said third switch from exceeding a second predetermined level when a flyback voltage is generated.

19. The circuit of claim 17 further comprising the step of generating a plurality of signals to control said first, second and third switches.

* * * * *